United States Patent [19]
Knowles et al.

[11] Patent Number: 5,663,828
[45] Date of Patent: *Sep. 2, 1997

[54] ACCESSORY DEVICE FOR MODULATING THE LASER OUTPUT OF A PEN-CLIP ACTUATABLE LASER POINTER

[75] Inventors: Carl H. Knowles, Morestown; Robert Blake, Woodbury Heights, both of N.J.

[73] Assignee: Metrologic Instruments, Inc., Blackwood, N.J.

[*] Notice: The term of this patent shall not extend beyond the expiration date of Pat. No. 5,473,464.

[21] Appl. No.: 564,991

[22] Filed: Nov. 30, 1995

Related U.S. Application Data

[63] Continuation of Ser. No. 276,127, Jul. 15, 1994, Pat. No. 5,473,464.
[51] Int. Cl.$^6$ .................................................... B43K 24/10
[52] U.S. Cl. ........................................ 359/237; 362/118
[58] Field of Search ............................. 359/257; 362/109, 362/253, 254, 259, 800

[56] References Cited

U.S. PATENT DOCUMENTS 5,319,190  6/1994  Allen et al. .
5,473,464  12/1995  Knowles et al. .................... 359/237

OTHER PUBLICATIONS

Product Brochure for ML211 Laser Pointer by Metrologic Instruments, Inc., Feb. 1994.
NL211 Laser Pointer Instructions and Applications by Metrologic Instruments, Inc., Brochure No. MLPN 2191, Feb. 16, 1993 (Revision), pp. 1–4.
Product Brochure for Metrologic ML868 and ML869 Helium–Neon Lasers.

*Primary Examiner*—Mark Hellner
*Attorney, Agent, or Firm*—Hopgood, Calimafde, Kalil & Judlowe

[57] ABSTRACT

A laser beam experimentation kit, including an accessory device for modulating the intensity of the visible laser beam produced as output from a laser pointer. The accessory device comprises a printed circuit(PC) board of physically thin construction, which is adapted for slidable insertion between the conductive tip portion and the conductive housing portion of a pen-clip actuatable laser pointer. A pair of conductive pads are formed on the upper and lower surfaces of the PC board. An input signal jack is mounted on PC board for the purpose of receiving a mated plug connector that is connected to a flexible cable carrying an electrical input signal. An electronic circuit and a battery power source are also mounted on the upper surface of the PC board. The function of the electronic circuit is to respond to a predetermined signal characteristic (e.g., the amplitude, frequency or phase) of the input signal supplied to the input signal jack, and to provide a variable load between the pair of conductive pads formed on the PC board. In this way, when the PC board is slidably inserted between the conductive tip portion and the conductive housing portion of the pen-like housing of the laser pointer, the pair of conductive pads on the PC board automatically establish electrical contact therewith without problems of alignment or the like. During joint operation of the laser pointer and the accessory device, the impedance of the variable load varies in response to variations in the predetermined signal characteristic of the electrical input signal. Such variations in the impedance of the variable load automatically modify the flow of electrical current through the laser diode in the laser pointer and thus modulates the intensity of the laser beam in accordance therewith.

32 Claims, 5 Drawing Sheets

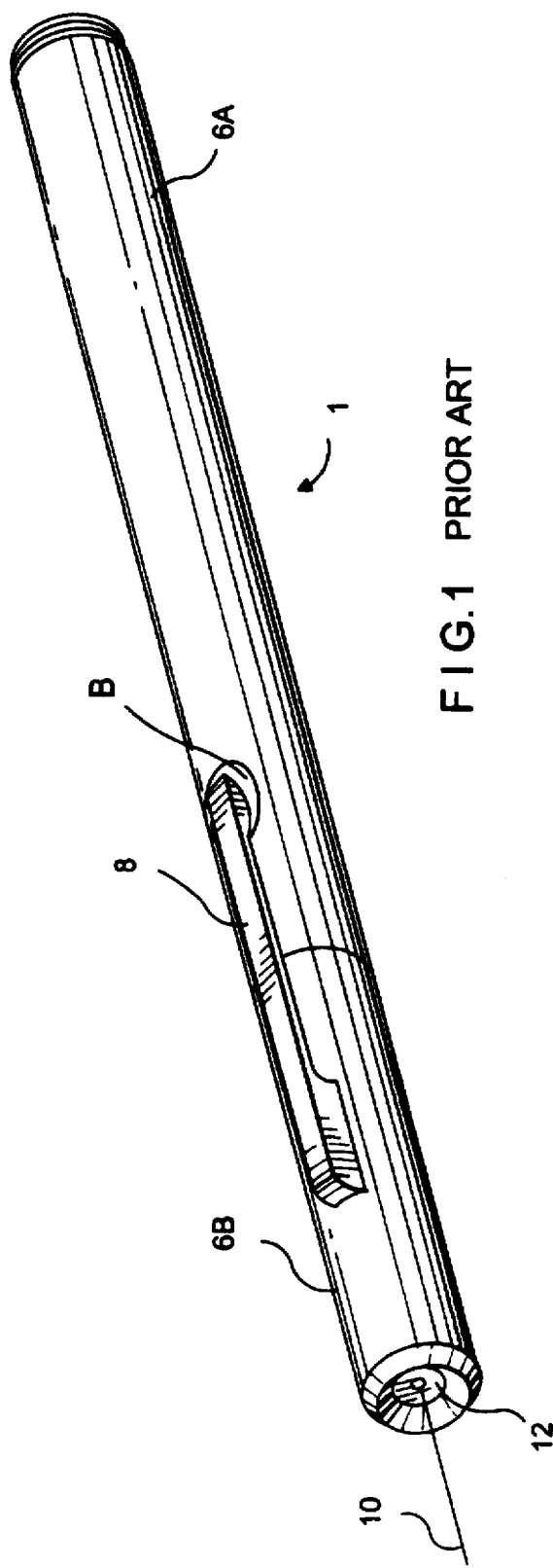
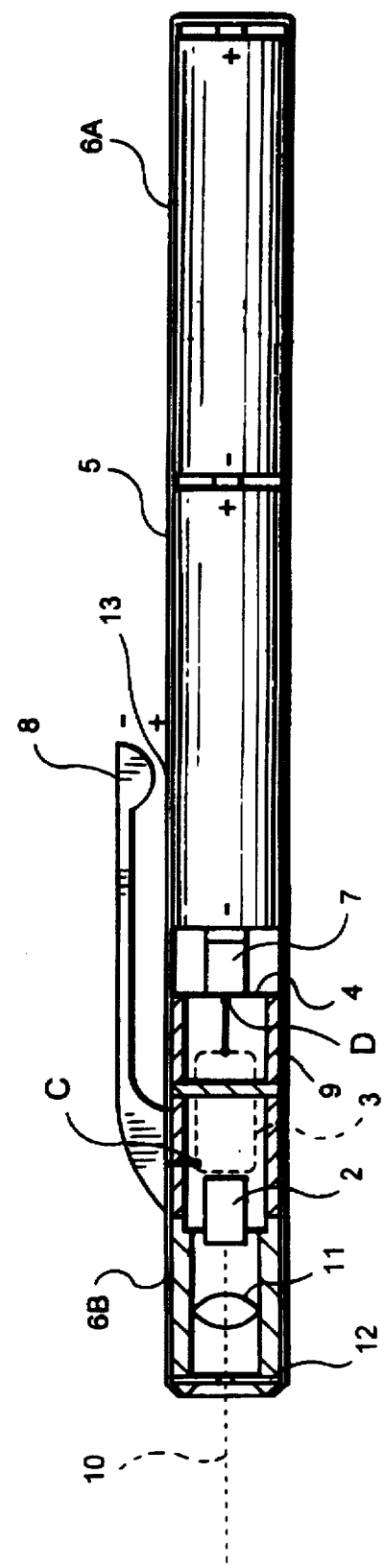
FIG. 1 PRIOR ART
FIG. 1A PRIOR ART

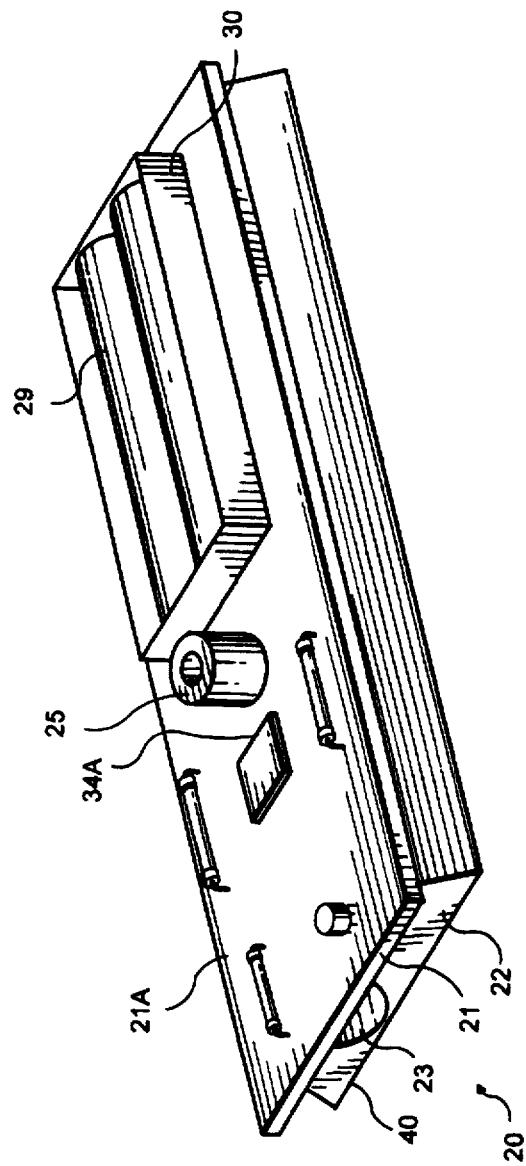
FIG. 2A
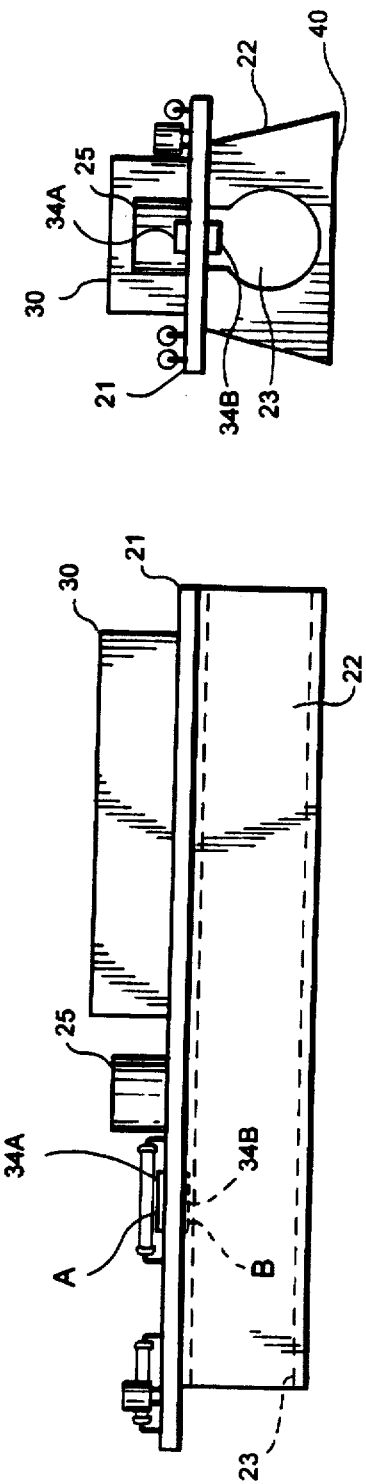
FIG. 2B
FIG. 2C

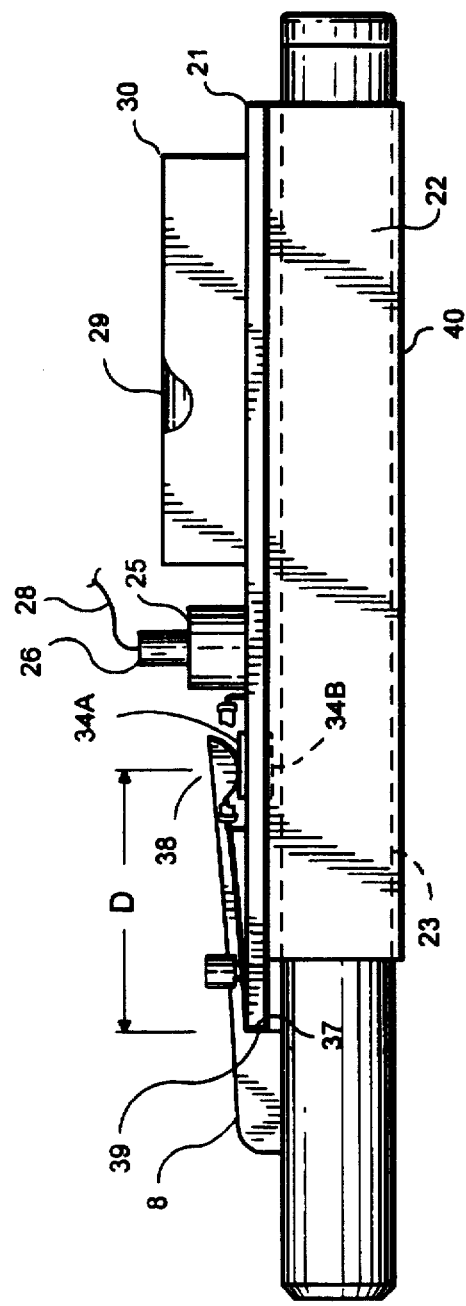
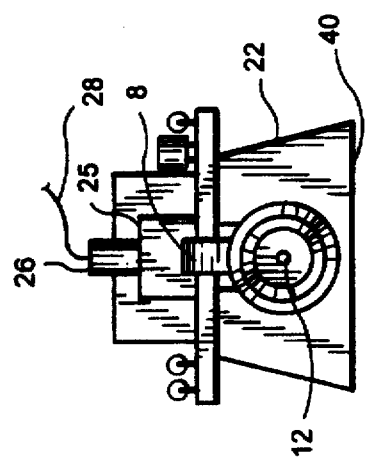
FIG. 4B
FIG. 4C

ACCESSORY DEVICE FOR MODULATING THE LASER OUTPUT OF A PEN-CLIP ACTUATABLE LASER POINTER

This is a continuation of application Ser. No. 08/276,127, filed Jul. 15, 1994 now U.S. Pat. No. 5,473,464.

BACKGROUND OF THE INVENTION

1. Field of the Invention

The present invention generally relates to laser pen pointers, and more particularly to an accessory device for modulating the laser beam output of a pen-clip actuatable laser pointer in accordance with an electrical input signal.

2. Brief Description of the State of the Art

Since the beginnings of time, man has always been fascinated with light. From the discovery of fire to the development of the light bulb, man has found new ways of using light to improve the general quality of life on Earth.

In recent times, the technological innovation of the visible laser diode has made it is much easier to produce visible laser beams for use in various applications. In response to the need for low power visible laser beams, a wide variety of VLD pen-based pointers have been recently developed. In general, each laser pen pointer includes a pen-like housing within which a solid-state visible laser diode, batteries and a laser drive circuit are compactly mounted. Many commercially available VLD pen pointers also have a pen clip for fastening onto a shirt pocket, like conventional pocket pens.

The ML211 Laser Pointer 1 sold by Metrologic Instruments, Inc. is illustrated in FIGS. 1 and 1A. As shown in FIG. 1A, the VLD 2 and laser drive circuit 3 are realized on a printed circuit (PC) board 4, which is arranged along with batteries 5 in a pen-like housing 6. As shown, pen-like housing 6 has conductive battery containing section 6A and a top section 6B which are electrically isolated from each other by way of insulative support collar 9. As shown, the positive (+) terminal of the battery supply is electrically connected to the barrel section 6A, whereas the negative (−) terminal of the battery supply establishes direct contact with the negative supply element 7 mounted to laser drive circuit 3 on PC board 4. In turn, the negative supply element 7 is directly connected to VLD drive circuit 3, and indirectly connected to electrically conductive pen-clip 8, which is fixedly mounted to the barrel section of the pen-like housing of the laser pointer. In order to electrically isolate the PC board from the metallic barrel section 6A, the PC board is supported within electrically insulative support collar 9. Also, VLD 2 is disposed along the optical axis 10 of a lens system 11 and an aperture stop 12 disposed at the end of the top section of the laser pointer.

In order to activate the VLD of the laser pointer shown in FIGS. 1 and 1A, the user simply depresses pen-clip 8 against the outer conductive surface 13 of the barrel section 6A, so that the conductive tip portion of the pen-clip contacts the conductive barrel section, thereby causing electrical power to flow from the batteries to the laser drive circuit. In turn, the laser drive circuit energizes the VLD to cause a narrowly focused visible laser beam to project from the aperture stop 12 at the end of the laser pointer.

The ML211 Laser Pointer from Metrologic Instruments, Inc. is exemplary of state of the art in VLD pen pointing devices. The uses to which such solid-state laser pointing devices can be put are limited only by the imagination of its user. A variety of conceived uses for pen-based laser pointers are described in the Instruction Booklet provided with each ML211 Laser Pointer, namely: Pointing at a Projected Image on a Screen; Making the Laser Beam Visible; Viewing Imperfections in an Ice Cube; Using Color Filters to Absorb Laser Light; Reflecting a Laser Beam with Colored Opaque Objects; Scanning Bar Codes; Reflection and Refraction at a Water Surface; Observing Internal Reflectance in a Test Tube; Observing Internal Reflections in a Curved Water Jet; Viewing Frosted Light Bulb Filaments; Proving the Law of Reflection; Deflecting the Laser Beam with Voice or Music; Curving a Laser Beam; Bending a Laser Beam with A Razor Blade; Spreading a Laser Beam with a Narrow Slit; Making a Laser Beam Twinkle; and Exercising Your Dog or Cat.

While the use of laser beams in optical communication applications is well known, unfortunately, however, there is no simple means for modulating the intensity of the laser beam produced from pen-actuatable laser pointers, such as the Metrologic® ML211 Laser Pointer. Consequently, such pen-based laser pointers are not readily usable for optical communication demonstration or laser beam modulation experiments.

Thus, there is a great need in the art for an accessory device that can be used in conjunction with pen-clip actuatable laser pointers in order to modulate the intensity of the laser beam produced therefrom, in response to either the instantaneous amplitude, frequency, or phase characteristics of an electrical input signal, such as an audio or video signal.

OBJECTS OF THE PRESENT INVENTION

Accordingly, it is a primary object of the present invention to provide an accessory device for use in modulating the intensity of the laser beam produced from a pen-clip actuatable laser pointer.

A further object of the present invention to provide such an accessory device, with an input signal jack for receipt of an electrical input signal, such as audio or video signal, that is used for the purpose of indirectly modulating the intensity of the laser beam produced from the laser pointer.

A further object of the present invention is to provide such an accessory device that can be electrically interfaced with the electronic circuitry within the laser pointer, without requiring any sort of disassembly or modification thereof.

A further object of the present invention is to provide such an accessory device with a printed circuit board for supporting the input jack and an electronic impedance modulation circuit, as well as supporting electronically conductive elements that facilitate the electrical interface of the accessory device with a pen-clip actuatable laser pointer.

A further object of the present invention is to provide such an accessory device, in which the impedance modulation circuit produces an electrical impedance that varies in response to instantaneous amplitude variations of the input modulation signal.

A further object of the present invention is to provide such an accessory device with a pair of electrical contacts that automatically engage the pen-clip and metal barrel section of the laser pointer when the accessory device is mechanically attached to the barrel portion thereof.

A further object of the present invention is to provide such an accessory device, which is designed to stably support the laser pointer and the PC board of the accessory device upon a flat surface during optical experiments and demonstrations.

A further object of the present invention is to provide a portable laser experimentation kit comprising a pen-clip actuatable laser pointer, the accessory device of the present invention, a photoreceiver circuit, and AM signal detection circuit, for use together in various types of laser beam applications.

A further object of the present invention is to provide a novel method of using a pen-clip actuatable laser pointer in laser beam modulation applications.

These and other objects of the present invention will become apparent hereinafter and in the claims to invention.

SUMMARY OF THE INVENTION

According to one of the broader aspects of the present invention, a laser beam experimentation kit is provided for use in diverse environments. In general, the kit comprises a pen-like laser pointer and an accessory device for use therewith. The laser pointer accessory device is provided for the purpose of modulating the intensity of the visible laser beam produced as output from the laser pointer.

In general, the laser pointer has a pen-like housing with an electrically conductive housing portion. Mounted within the pen-like housing is a laser diode for producing a laser beam along an optical axis that extends from one end of the pen-like housing. Also contained within the pen-like housing is a laser diode drive circuit for energizing the laser diode, and a battery power source for providing electrical power to the laser diode drive circuit. Fixedly attached to the exterior surface of the pen-like housing is a pen-clip having a conductive tip portion disposed adjacent the conductive housing. The laser diode, drive circuit, battery power source, conductive tip portion and the conductive housing portion are connected together in an electrical series configuration. The pen-clip is manually depressible by the user's finger so that the conductive tip portion contacts the conductive housing portion of the pen-like housing. When the pen-clip is depressed and the conductive tip thereof contacts the conductive housing portion, the battery source supplies electrical power to the drive circuit, and the drive circuit, in turn, energizes the laser diode. In response to the energization of laser diode, the laser diode produces a visible laser beam along the optical axis of the laser pointer.

In general, the laser pointer accessory device of the present invention comprises a first support structure of physically thin construction. The first support structure has an upper surface and a lower surface, for slidable insertion between the conductive tip portion and the conductive housing portion of the laser pointer. First and second conductive elements are operably connected to the upper and lower surfaces of the first support structure, respectively. A second support structure is operably connected to the first support structure, for supporting electronic components, such as an input signal receiving means, a battery power means, and an electronic impedance modulation circuit. The function of the input signal receiving means is to receive electrical input signal having amplitude, frequency or phase characteristics that may vary over time. The function of the power supply means is to provide electrical power to the electronic impedance modulation circuit. In general, the electronic impedance modulation circuit is responsive to a predetermined signal characteristic of the input signal, such as instantaneous amplitude, frequency or phase thereof, and provides an variable load between the first and second conductive elements.

When the first support structure is slidably inserted between the conductive tip portion and the conductive housing portion of the pen-like housing, the first and second conductive elements establish electrical contact with the conductive tip portion and the conductive housing portion of the pen-like housing. During joint operation of the laser pointer and the accessory device, the electrical input is received by the input signal receiving means and the impedance of the variable load automatically responds to variations in the intensity of the electrical input signal provided to the input signal jack. In turn, this modifies the flow of electrical current through the laser diode and thus modulates the intensity of the laser beam.

In the illustrative embodiment, the impedance of the variable load is designed to vary in response to variations in the amplitude characteristics of the electrical input signal. The variable load in the accessory device of the illustrative embodiment comprises a solid-state transistor having a base, an emitter and a collector. The input jack is operably connected to the base, the first conductive element is operably connected to the emitter, and the second conductive element is operably connected to the collector. When the amplitude level of the input signal falls below a predetermined threshold level, the transistor is biased in its "OFF" condition, and when the amplitude level of the input signal rises above the predetermined threshold level, the transistor is forwardly biased (i.e., in its "ON" condition). In the forward biased state, the real component of the electrical impedance (i.e., resistance) presented by the variable load, varies in direct response to the amplitude characteristics of the input signal. Consequently, the electrical current flowing through the visible laser diode in the laser pointer also varies in response to the amplitude characteristics of the input signal. Thus, the intensity of the laser beam produced therefrom is modulated in response to the amplitude characteristics of the input signal provided to the accessory device.

The advantages of the laser pointer accessory device of the present invention are numerous and will become apparent hereinafter.

BRIEF DESCRIPTION OF THE DRAWINGS

For a more complete understanding of the principles of the present invention, the following Detailed Description of the Illustrative Embodiment should be read in conjunction in with the accompanying drawings, wherein:

FIG. 1 is a perspective view of a prior art pen-clip actuatable laser pointer;

FIG. 1A is an elevated cross-sectional view of the pen-clip actuatable laser pointer shown in FIG. 1;

FIG. 2A is a perspective view of the laser pointer accessory device of the present invention;

FIG. 2B is an elevated side view of the accessory device of the present invention;

FIG. 2C is an elevated end view of accessory device of the present invention;

FIG. 4B is an elevated side view of the accessory device attached to the pen-clip laser pointer of FIG. 1; and FIG. 4A is an elevated end view of the accessory device attached to the pen-clip laser pointer of FIG. 1.

DETAILED DESCRIPTION OF THE ILLUSTRATIVE EMBODIMENT OF THE PRESENT INVENTION

Referring to FIGS. 2A to 4C, the laser pointer accessory device of the present invention will be described in detail below.

As shown in FIGS. 2A to 2C, accessory device 20 comprises a miniature printed circuit (PC) board 21 and a laser pointer support base 22 attached to the underside of the PC board. As shown, PC board 21 has a longitudinal extent along which support base 22 is mounted by projections (not shown) that pass through predrilled holes in the PC board. Along the centerline of the support base is a cylindrical bore 23 having an inner diameter that is slightly larger than the outer diameter of the barrel portion of the laser pointer shown in FIG. 1. As shown in FIG. 2C, the upper portion of the support base has a longitudinally extending slot 23A, the purpose of which will be described hereinafter.

Figure 3A:
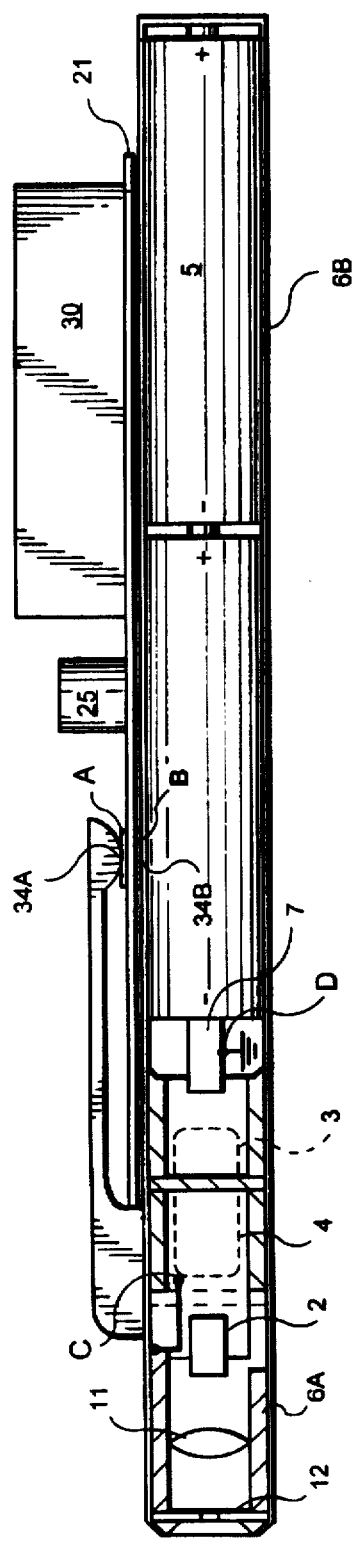
FIG. 3 is a schematic diagram of the laser drive circuitry aboard the laser pointer of FIG. 1, as well as the impedance modulation circuitry aboard the accessory device of the present invention.
Figure 3:
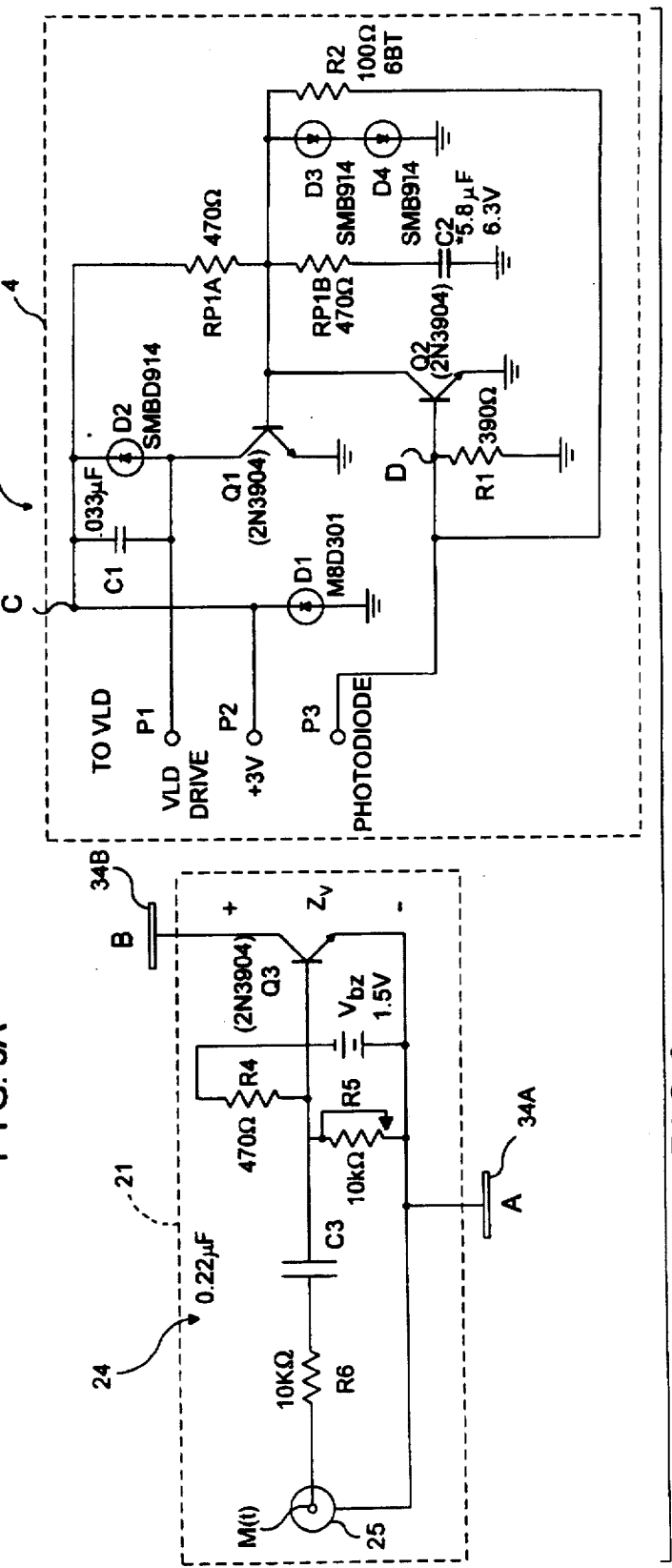

As shown in FIG. 3, a number of electrical and electronic components are configured together in order to realize the electronic impedance modulation circuit of the present invention, indicated by reference number 24. As shown in FIG. 2A, these components are mounted upon the upper surface 21A of the PC board. In the illustrative embodiment, the electrical components used to realize the modulation circuit of the present invention are mounted onto PC board 22 using surface mounting techniques well known in the art. The function of these components will be described below.

As illustrated in FIG. 3, the three electrical terminals of VLD package 2 in the laser pointer are connected to points P1, P2, and P3 in the VLD drive circuit 3, realized on the PC board in the top section of the laser pointer housing. As best illustrated in FIG. 3, the positive supply voltage lead "C" in VLD drive circuit 3 is electrically connected to the conductive top housing section 6A and conductive pen-clip 8, whereas the metallic barrel section 6A of the laser pointer housing is connected to the positive voltage supply voltage side of the batteries, indicated at "B". The function of transistor Q1 is to supply current to VLD 2 while maintaining a substantially constant voltage thereacross by way of voltage feedback from transistor Q2 driven by photodiode output of VLD 2. The function of schockey diode D1 and diode D2 is VLD protection. The function of transistor Q2 and its surrounding components (i.e., resistors RP1A, RP1B, R1, and R2, capacitor C2 and diodes D3 and D4) is to sense at point P3 the feedback current produced by the photodiode in the VLD package 2 and provide a feedback voltage to the base of transistor Q2 which prevents transistor Q1 from driving VLD 2 so that its laser beam output exceeds a predetermined intensity threshold, thus regulating the output power of the VLD 2.

Figure 4A:
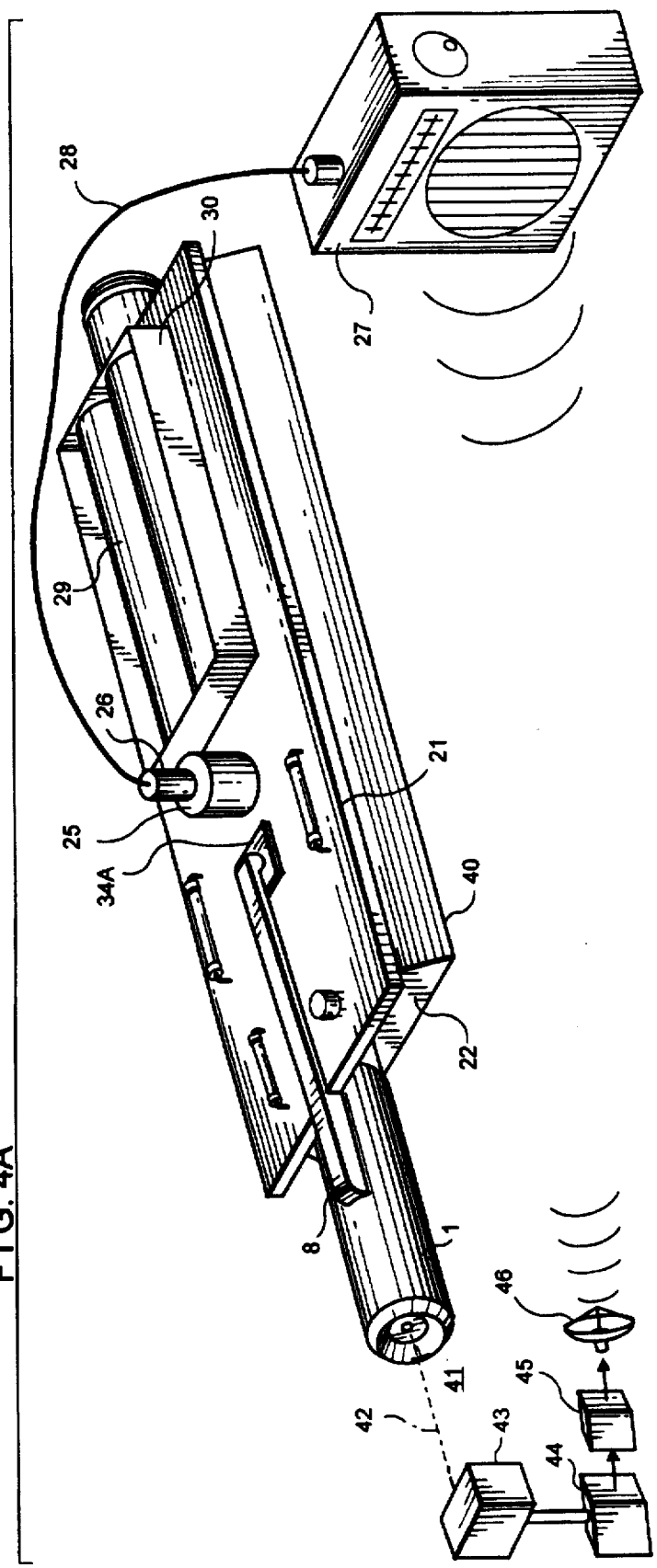
FIG. 4A is a perspective view of the accessory device attached to the pen-clip laser pointer of FIG. 1.

As shown in the schematic drawings of FIG. 3, impedance modulation circuit 24 connects between the pen-clip of the laser pointer, indicated at point "A" and the conductive barrel section 6B of the laser pointer housing, indicated at point "B", when the accessory device is clipped onto the laser pointer as best shown in FIGS. 4A, 4B, and 4C. As shown in FIG. 3, impedance modulation circuit 24 includes a standard RCA jack 25 for receiving an electrical input signal from a mated plug connector 26. Preferably, the mated plug connector is connected to an audio or video signal source 27 by way of a flexible shielded electrical cable 28. In the illustrative embodiment, impedance modulation circuit 24 is energized by a single 1.5 volt battery cell 29, supported in a small battery case 30 mounted longitudinally along the upperside of PC board 21.

As shown in FIG. 3, transistor Q3 is biased using fixed resistor R4=470 ohms and variable resistor (i.e., potentiometer) R5z 10k ohms so that the impedance across the collector and emitter of transistor Q3 is very high when the amplitude level of the input signal at input jack 25 (and thus the base of transistor Q3) falls below a predetermined threshold level manually set by variable resistor R5. Capacitor C3, in conjunction with resistors R4 and R5 provide a high-pass input filter which, in the illustrative embodiment, blocks DC signal components and only passes to the base of transistor Q3, frequency components in the range of from about 10 Hz to about 4.0 MHz. It is understood, however, that the frequency response of this input filter may vary from illustrative embodiment to illustrative embodiment.

To permit simple insertion of impedance modulation circuit 24 between the emitter of transistor Q1 and electrical ground in the VLD drive circuit of the laser pointer, a pair of electrically conductive pads 34A and 34B are mounted to opposing sides of PC board 21 along the longitudinal axis of the PC board. As shown in FIG. 3, conductive pad 34A is disposed on the upper side of PC board 21 whereas conductive pad 34B is disposed on the underside of PC board 21 between slot 23A longitudinally extending along support base 22. As shown in FIG. 4B, conductive pads 34A and 34B are disposed along PC board at a distance D, measured from the edge 37 thereof, which is equal to the distance of the pen-clip tip 38 to its base 39. In this way, when the barrel section of the laser pointer is inserted within bore 23 of support base 22, and PC board 21 is slid underneath pen-clip 8 as shown in FIG. 4A, the pen-clip tip 38 automatically engages conducting pad 34A on the upper surface of PC board 21, whereas the conductive barrel section of the laser pointer engages conductive pad 34B, disposed beneath conducting pad 34A, on the underside of PC board 21.

When the laser pointer accessory device is attached to the laser pointer as shown in FIGS. 4A to 4C, impedance modulation circuit 24 aboard the accessory device is automatically connected to the VLD drive circuit 3 in the laser pointer, as shown in FIG. 3. When impedance modulation circuit 24 is connected with VLD drive circuit 3 in the laser pointer as shown in FIG. 3 and an input signal is provided to input jack 25, current is permitted to flow from the 3 volt supply 6A, through the collector of transistor Q3 to emitter thereof, through the pen-clip 8, through forwardly biased VLD 2 and forwardly biased transistor Q1, and thus is limited only by the output impedance of transistor Q3 in response to the input signal M(t). In accordance with the present invention, impedance modulation circuit 24, or more specifically, transistor Q3, provides an "active" load $Z_v$ between the emitter of transistor Q1 and electrical ground in VLD drive circuit 3. The characteristics of transistor Q3 are selected so that the electrical impedance between the collector and the emitter terminals thereof at 10 Hz to about 10 MHz varies substantially linearly with variations in the amplitude of the input modulation signal M(t) provided to the base terminal of transistor Q3. As the amplitude of the input modulation signal M(t) changes over time, so too does the drive current through transistor Q1 and VLD 2, and thus the intensity of the laser beam produced therefrom is modulated in accordance with the amplitude variations of the input signal M(t). In the illustrative embodiment, the input voltage versus output current characteristics of the transistor comprising the variable load $Z_v$ are selected so that the current flowing from the emitter to the collector thereof, and thus through visible laser diode 2, varies substantially linearly with variations in amplitude in the electrical input signal. It is understood, however, that other (e.g., nonlinear) input signal/laser beam intensity characteristics can be established in a manner known in the art.

As shown in FIG. 4C, support base 22 of the accessory device has a flat bottom surface 40 which permits the accessory device and laser pointer to be positioned together on a flat support surface 41, such as a floor, table or work bench. In this arrangement, the flat support surface can function as an optical bench upon which various optical and electro-optical components can be supported during user experimentations and demonstrations. In alternative embodiments, support device 22 may have a different geometry from that shown in the drawings. However, even in such alternative embodiments, it is preferred that the support base be capable of gripping, holding, or clasping onto at least a portion of the laser pointer housing, and ensure automatic alignment between electrical pads 34A and 34B and the pen-clip tip portion and conductive barrel section of the laser pointer housing, respectively.

In the illustrative embodiment shown in FIG. 4A, laser pointer 1 is connected to the accessory device of the present invention and is used in combination with several other components provided in the laser beam modulation kit of the present invention-namely, photoreceiver 43, AM detection circuit 44, and signal amplifier circuit 45. For purposes of illustration, the resulting system shown in FIG. 4A is used in an optical communication demonstration. In this application, the input signal source 27 is a portable radio that supplies an input modulation signal M(t) to input jack 25, by way of shielded cable 28 and phono-plug 26. In order to detect the intensity of the modulated laser beam produced from laser pointer 1 when modulation signal M(t) is supplied to the input jack of the impedance modulation circuit 24, the experimentation kit of the present invention includes photodetection device (i.e., photoreceiver) 43 is positioned along the optical axis of the laser pointer as shown. Notably, the placement of the photoreceiver may be a few inches away from the aperture stop of the laser pointer, up to hundreds of feet away therefrom. The electrical signal produced from photoreceiver 43 is provided to AM detection circuit 44, which detects amplitude variations in the produced electrical signal, corresponding to input signal M(t). In order to reproduce the input signal at the photoreceiver, the electrical signal produced from AM detection circuit 44 is amplified by amplifier 45 and the amplified signal is used to drive an electro-acoustical device 46, such as an audio-speaker.

It is understood that the above described optical communication system is only one use for the laser pointer accessory device of the present invention. Other uses will become apparent to the experimenter.

While the illustrative embodiment of the laser accessory device shown and described above will be useful in many applications, further modifications to the present invention will occur to persons with ordinary skill in the art. All such modifications are deemed to be within the scope and spirit of the present invention defined by the appended claims to invention.

What is claimed is:

1. An accessory device for modulating the intensity of the visible laser beam produced as output from a laser pointer including:
   a pen-like housing having a conductive housing portion and containing
   a pen-like housing having a conductive housing portion and containing
   a laser diode for producing a laser beam along an optical axis extending from one end of said pen-like housing,
   a drive circuit for energizing said laser diode,
   a battery power source for providing electrical power to said drive circuit, and
   a pen-clip fixedly attached to the exterior of said pen-like housing and having a conductive tip portion disposed adjacent said conductive housing and being depressible so that said conductive tip portion contacts said conductive housing portion, said laser diode, said drive circuit, said battery power source, said conductive tip portion and said conductive housing portion being connected together in a series configuration so that when said conductive tip portion contacts said conductive housing portion, said drive circuit energizes said laser diode and said laser diode produces said visible laser beam along said optical axis, said accessory device comprising:
   a support structure for slidable insertion between said conductive tip portion and said conductive housing portion of said laser pointer;
   first and second conductive elements operably connected to said support structure;
   input signal receiving means for receiving an electrical input signal having a predetermined signal characteristic which may vary over time;
   an electronic circuit operably connected to said first and second conductive elements, and said input signal receiving means;
   electrical power supply means for supplying electrical power to said electronic circuit;
   said electronic circuit being responsive to the predetermined signal characteristic of said electrical input signal and providing a variable load between said first and second conductive elements such that, when said support structure is inserted between said conductive tip portion and said conductive housing portion of said pen-like housing, said first and second conductive elements establish electrical contact with said conductive tip portion and said conductive housing portion, and when the electrical input signal is received by said input signal receiving means, the impedance of said variable load modifies the flow of electrical current through said laser diode so as to modulate the intensity of said laser beam in response to variations in the predetermined signal characteristic of said electrical input signal.

2. The accessory device of claim 1, wherein said predetermined signal characteristic is the amplitude of said electrical input signal.

3. The accessory device of claim 1, wherein said electrical power supply means comprises a battery power source, and said input signal receiving means comprises an input signal jack for receiving a mated plug connector connected to a flexible cable carrying said electrical input signal.

4. The accessory device of claim 1, wherein said input signal jack, said battery power source, and said electronic circuit are mounted on a printed circuit board.

5. The accessory device of claim 1, wherein said first and second conductive elements are realized as first and second conductive pads formed on said printed circuit board.

6. The accessory device of claim 1, wherein said first and second conductive elements are realized as first and second conductive pads formed on said printed circuit board.

7. The accessory device of claim 1, which further comprises laser pointer receiving means for receiving at least a portion of the pen-like housing of said laser pointer when said support structure is slidably inserted between said conductive tip portion and said conductive housing portion of said pen-like housing.

8. The accessory device of claim 7, wherein said laser pointer receiving means comprises a base portion having a substantially flat surface for supporting said accessory device and said laser pointer received within said laser pointer receiving means, on a substantially flat support surface.

9. The accessory device of claim 8, wherein said base portion includes a bore through which at least a portion of said pen-like housing can be received when said support structure is slidably inserted between said conductive tip portion and said conductive housing portion of said pen-like housing.

10. The accessory device of claim 3, wherein said variable load comprises a transistor having a base, an emitter and a collector, wherein said input signal jack is operably connected to said base, said first conductive element is operably connected to said emitter, and said second conductive element is operably connected to said collector, and wherein said transistor is normally biased in off condition when the amplitude of said electrical input signal is below a predetermined threshold level, and said transistor is forwardly biased when the amplitude of said electrical input signal is above said predetermined threshold level.

11. The accessory device of claim 10, wherein said electronic circuit further comprises means for manually setting said predetermined threshold level.

12. A laser beam experimentation kit comprising:
(A) a laser pointer including
  (1) a pen-like housing having a conductive housing portion,
  (2) a laser diode for producing a laser beam along an optical axis extending from one end of said pen-like housing,
  (3) a drive circuit for energizing said laser diode,
  (4) a battery power source for providing electrical power to said drive circuit, and
  (5) a pen-clip fixedly attached to the exterior of said pen-like housing and having a conductive tip portion disposed adjacent said conductive housing portion and being manually depressible so that said conductive tip portion contacts said conductive housing portion, said laser diode, said drive circuit, said battery power source, said conductive tip portion and said conductive housing portion being connected together in a series configuration so that when said conductive tip portion contacts said conductive housing portion, said drive circuit energizes said laser diode and said laser diode produces said visible laser beam along said optical axis; and (B) a portable accessory device for modulating the intensity of the visible laser beam produced from said laser pointer, said accessory device including
  (1) support structure for slidable insertion between said conductive tip portion and said conductive housing portion of said laser pointer,
  (2) first and second conductor elements operably connected to said support structure,
  (3) an input signal receiving means for receiving an electrical input signal having a predetermined signal characteristic which may vary over time,
  (4) electrical power supply means,
  (5) an electronic circuit operably connected to said first and second conductive elements, said input receiving means, and said electrical power supply means, said electronic circuit being responsive to the predetermined signal characteristic of said electrical input signal and providing a variable load between said first and second conductive elements such that, when said support structure is slidably inserted between said conductive tip portion and said conductive housing portion of said pen-like housing, said first and second conductive elements establish electrical contact with said conductive tip portion and said conductive housing portion of said pen-like housing, and when said electrical input signal is received by said input signal receiving means, the impedance of said variable load modifies the flow of electrical current through said laser diode so as to modulate the intensity of said laser beam in response to variations in said predetermined signal characteristic of said electrical input signal.

13. The laser beam experimentation kit of claim 12, wherein said predetermined signal characteristic comprises the amplitude of said electrical input signal.

14. The laser beam experimentation kit of claim 12, wherein said electrical power supply means comprises a battery power source, and said input signal receiving means comprises an input signal for receiving a mated plug connector connected to a flexible cable carrying said electrical input signal.

15. The laser beam experimentation kit of claim 14, wherein said input signal jack, said battery power source, and said electronic circuit are mounted on a printed circuit board.

16. The laser beam experimentation kit of claim 15, wherein said first and second conductive elements are realized as first and second conductive pads formed on said printed circuit board.

17. The laser beam experimentation kit of claim 15, wherein said first and second conductive elements are realized as first and second conductive pads formed on said printed circuit board.

18. The laser beam experimentation kit of claim 12, which further comprises laser pointer receiving means for receiving at least a portion of the pen-like housing of said laser pointer when said support structure is slidably inserted between said conductive tip portion and said conductive housing portion of said pen-like housing.

19. The laser beam experimentation kit of claim 18, wherein said laser pointer receiving means comprises a base portion having a substantially flat surface for supporting said accessory device and said laser pointer received within said laser pointer receiving means, on a substantially flat support surface.

20. The laser beam experimentation kit of claim 19, wherein said base portion includes a bore through which at least a portion of said pen-like housing can be received when said support structure is slidably inserted between said conductive tip portion and said conductive housing portion of said pen-like housing.

21. The laser beam experimentation kit of claim 13, wherein said variable load comprises a transistor having a base, an emitter and a collector, and wherein said input signal jack is operably connected to said base, said first conductive element is operably connected to said emitter, and said second conductive element is operably connected to said collector, and wherein said transistor is normally biased in off condition when the amplitude of said electrical input signal is below a predetermined threshold level, and said transistor is forwardly biased when the amplitude of said electrical input signal is above said predetermined threshold level.

22. The laser beam experimentation kit of claim 21, wherein said electronic circuit further comprises means for manually setting said predetermined threshold level.

23. An accessory device for modulating the intensity of the visible laser beam produced as output from a laser pointer including a pen-like housing having a conductive housing portion and containing a laser diode for producing a laser beam along an optical axis extending from one end of said pen-like housing, a drive circuit for energizing said laser diode, a battery power source for providing electrical power to said drive circuit, and a pen-clip fixedly attached to the exterior of said pen-like housing and having a conductive tip portion disposed adjacent said conductive housing and being depressible so that said conductive tip portion contacts said conductive housing portion, said laser diode, said drive circuit, said battery power source, said conductive tip portion and said conductive housing portion being connected together in a series configuration so that when said conductive tip portion contacts said conductive housing portion, said drive circuit energizes said laser diode and said laser diode produces said visible laser beam along said optical axis, said accessory device comprising:

- a support structure, for operably connecting with said conductive tip portion and said conductive housing portion of said laser pointer;
- first and second conductive elements operably associated with said support structure;
- an input signal receiving means for receiving an electrical input signal having a predetermined signal characteristic which may vary over time; and
- an electronic circuit operably connected to said first and second conductive elements, and said input signal receiving means, and being responsive to the predetermined signal characteristic of said electrical input signal and providing a variable load between said first and second conductive elements such that, when said support structure is operably connected to said conductive tip portion and said conductive housing portion of said pen-like housing, said first and second conductive elements establish electrical contact with said conductive tip portion and said conductive housing portion of said pen-like housing, and when electrical input signal is received by said input signal receiving means, the impedance of said variable load modifies the flow of electrical current through said laser diode so as to modulate the intensity of said laser beam in response to variations in the predetermined signal characteristic of said electrical input signal.

24. The accessory device of claim 23, wherein said predetermined signal characteristic is the amplitude of said electrical input signal.

25. The accessory device of claim 23, wherein electrical power supply means comprises a battery power source, and said input signal receiving means comprises an input signal jack for receiving a mated plug connector connected to a flexible cable carrying said electrical input signal.

26. The accessory device of claim 23, wherein said input signal jack, said battery power source, and said electronic circuit are mounted on a printed circuit board.

27. The accessory device of claim 26, wherein said first and second conductive elements are realized as first and second conductive pads formed on said printed circuit board.

28. The accessory device of claim 27, which further comprises laser pointer receiving means for receiving at least a portion of the pen-like housing of said laser pointer when said support structure is slidably inserted between said conductive tip portion and said conductive housing portion of said pen-like housing.

29. The accessory device of claim 23, wherein said laser pointer receiving means comprises a base portion having a substantially flat surface for supporting said accessory device and said laser pointer received within said laser pointer receiving means, on a substantially flat support surface.

30. The accessory device of claim 29, wherein said base portion includes a bore through which at least a portion of said pen-like housing can be received when said support structure is slidably inserted between said conductive tip portion and said conductive housing portion of said pen-like housing.

31. The accessory device of claim 23, wherein said variable load comprises a transistor having a base, an emitter and a collector, wherein said input signal jack is operably connected to said base, said first conductive element is operably connected to said emitter, and said second conductive element is operably connected to said collector, and wherein said transistor is normally biased in off condition when the amplitude of said electrical input signal is below a predetermined threshold level, and said transistor is forwardly biased when the amplitude of said electrical input signal is above said predetermined threshold level.

32. The accessory device of claim 31, wherein said electronic circuit further comprises means for manually setting said predetermined threshold level.

* * * * *